(12) United States Patent
Windisch et al.

(10) Patent No.: US 11,222,999 B2
(45) Date of Patent: Jan. 11, 2022

(54) DEVICE COMPRISING LEADFRAMES, AND METHOD FOR PRODUCING A PLURALITY OF DEVICES

(71) Applicant: OSRAM OLED GmbH, Regensburg (DE)

(72) Inventors: Reiner Windisch, Pettendorf (DE); Florian Bösl, Regensburg (DE); Andreas Dobner, Wenzenbach (DE); Matthias Sperl, Mintraching (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/649,551

(22) PCT Filed: Sep. 21, 2018

(86) PCT No.: PCT/EP2018/075648
§ 371 (c)(1),
(2) Date: Mar. 20, 2020

(87) PCT Pub. No.: WO2019/063436
PCT Pub. Date: Apr. 4, 2019

(65) Prior Publication Data
US 2020/0313054 A1   Oct. 1, 2020

(30) Foreign Application Priority Data
Sep. 27, 2017  (DE) .................. 10 2017 122 410.6

(51) Int. Cl.
*H01L 33/62* (2010.01)
*H01L 33/54* (2010.01)

(52) U.S. Cl.
CPC .............. *H01L 33/62* (2013.01); *H01L 33/54* (2013.01)

(58) Field of Classification Search
CPC ......... H01L 32/62; H01L 32/54; H01L 33/62; H01L 33/54
(Continued)

(56) References Cited

U.S. PATENT DOCUMENTS

2009/0224280 A1   9/2009  Tsai et al.
2013/0256733 A1*  10/2013  Lin ................... H01L 23/49562
                                                257/99
(Continued)

FOREIGN PATENT DOCUMENTS

CN    104319345 A      1/2015
DE    202014001943 U1  6/2014
WO    2017/202456 A1   11/2017

OTHER PUBLICATIONS

International Search Report issued for corresponding International Patent Application No. PCT/EP2018/075648 dated Jan. 3, 2019, along with an English translation, citing above-references.
(Continued)

*Primary Examiner* — Igwe U Anya
(74) *Attorney, Agent, or Firm* — Hauptman Ham, LLP

(57) ABSTRACT

A device with a lead frame, a moulded body and a plurality of semiconductor chips configured to generate radiation is specified, wherein
the lead frame has two connection parts for external electrical contacting of the device;
the moulded body is formed to the lead frame;
the moulded body is transmissive to the radiation generated during operation of the device; and
the semiconductor chips are arranged on a front-side of the moulded body and each of the semiconductor chips overlap with the device with the moulded body in plan view of the device.
Furthermore, a method for producing devices is specified.

15 Claims, 7 Drawing Sheets

Figure 1:
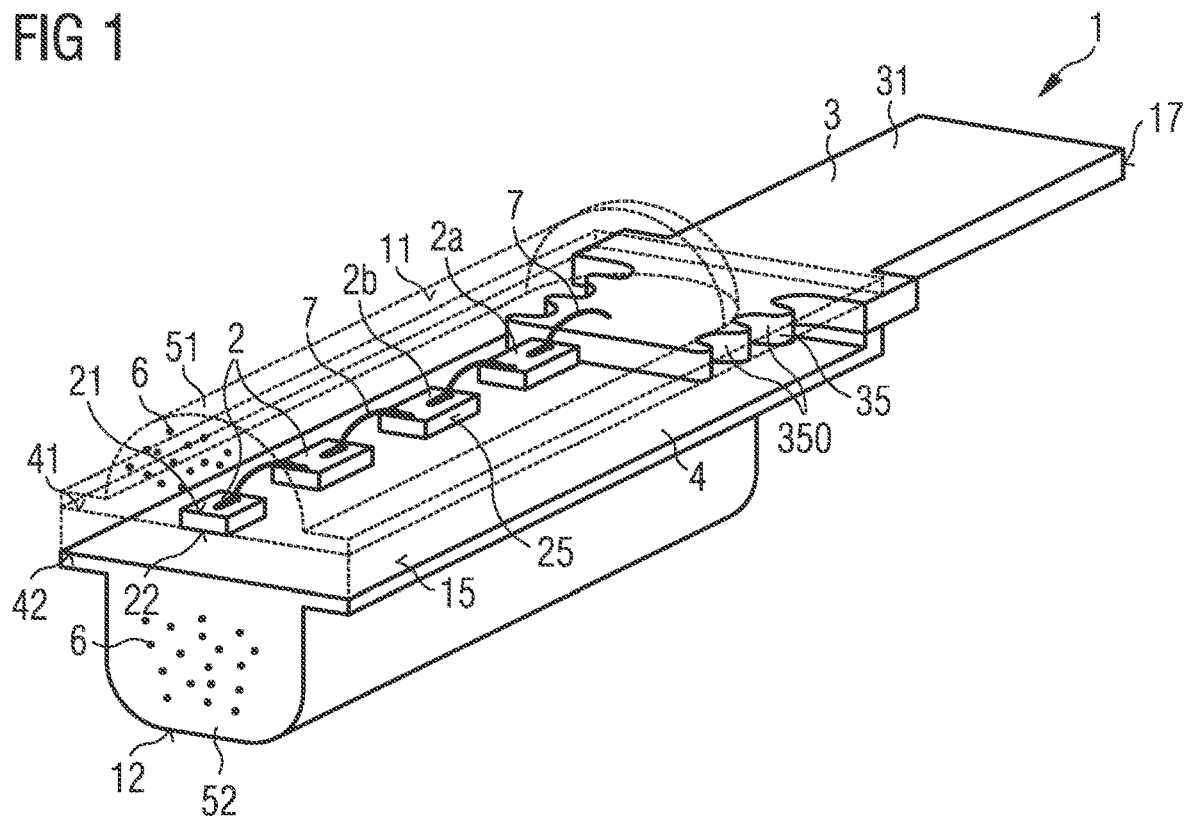

(58) Field of Classification Search
USPC .......................................................... 257/81
See application file for complete search history.

(56) References Cited

U.S. PATENT DOCUMENTS

| | | | |
|---|---|---|---|
| 2017/0051878 A1* | 2/2017 | Jiang | .................. H01L 25/0753 |
| 2017/0084809 A1* | 3/2017 | Jiang | ...................... H01L 33/56 |
| 2017/0130906 A1* | 5/2017 | Jiang | ....................... F21K 9/232 |
| 2017/0227169 A1* | 8/2017 | Jiang | ....................... F21K 9/235 |
| 2018/0097154 A1* | 4/2018 | Marfeld | ................ H01L 27/153 |

OTHER PUBLICATIONS

Written Opinion issued for corresponding International Patent Application No. PCT/EP2018/075648 dated Jan. 3, 2019.
Datasheet "DURIS S 2", Version 2.1, GW SBLMA1.EM; Published by OSRAM OPTO Semiconductors GmbH, Jan. 27, 2016, 25 pages.
Search Report issued for corresponding German Patent Application No. 10 2017 122 410.6 dated Apr. 18, 2020, citing above references.

* cited by examiner

52

DEVICE COMPRISING LEADFRAMES, AND METHOD FOR PRODUCING A PLURALITY OF DEVICES

CROSS REFERENCE TO RELATED APPLICATION

This application is a National Stage of International Application No. PCT/EP2018/075648, filed on Sep. 21, 2018, which designates the United States and was published in Europe, and which claims priority to German Patent Application DE 10 2017 122 410.6, filed on Sep. 27, 2017, in the German Patent Office. Both of the aforementioned applications are hereby incorporated by reference in their entireties.

The present application relates to an in particular radiation emitting device and a method for producing such a device.

Conventional light bulbs are now increasingly being replaced by light sources based on light-emitting diodes. In particular, LED filaments are used in which several LEDs are arranged on a strip-shaped substrate and surrounded by a silicone matrix. These LED filaments imitate the filament of a conventional light bulb and cause an omnidirectional radiation. Such filaments can be integrated in a glass bulb, which is identical to the gas bulb of incandescent lamps. However, the production of such LED filaments is very different from the production of other LED-based components, such as surface-mountable components. Typically, this requires a separate production line for the LED filaments.

It is a object to specify a device that can be easily and reliably produced and with which an all-sided radiation can be achieved. Furthermore, a method should be specified with which such devices can be produced easily and efficiently.

These objects are solved, among other things, by a device or a method according to the independent claims. Further embodiments and experiences are the subject-matter of the dependent claims.

A device is specified, which is configured in particular for the generation of radiation, for example in the visible spectral range.

According to at least one embodiment of the device, the device has a lead frame. The lead frame has in particular two connection parts for external electrical contacting of the device. The connection parts each form a contact surface accessible from the outside for external electrical contacting, so that when an electrical voltage is applied during operation of the device, a current flows through the device between the two connection parts and radiation is generated.

The lead frame, for example, is formed as a flat metal sheet. For example, the lead frame contains copper or stainless steel or consists of such a material. The lead frame can also be provided with a coating at least in places, for example a reflectivity increasing coating and/or a coating that simplifies the production of a wire bond connection.

The connection parts can further be provided for fixing the device. For example, the connection parts of the device are formed so that they are spot-weldable.

According to at least one embodiment of the device, the device has a moulded body. The moulded body is expediently formed to be electrically insulating. For example, the moulded body contains a plastic material. For example, the plastic material can be processed by a moulding process.

A moulding process is generally understood to be a process by which a moulding material can be formed in accordance with a predetermined form and, if necessary, cured. In particular, the term "moulding process" includes moulding, film assisted transfer moulding, injection moulding, transfer moulding and compression moulding.

For example, the moulded body is formed to the lead frame. At the points where the moulded body is moulded to the lead frame, the moulded body is directly adjacent to the lead frame and follows the outer shape of the lead frame.

Furthermore, the moulded body is expediently transmissive to the radiation generated during operation of the device. For example, a base material of the moulded body absorbs at most 20%, in particular at most 5%, of the incident light, during a vertical radiation passage through the moulded body in the the given vertical extension of the moulded body. A vertical direction is understood to be a direction extending perpendicular to a principal plane of extension of the moulded body.

The base material of the moulded body can be mixed with particles, for example to increase the thermal conductivity of the moulded body. Furthermore, a radiation conversion material can be arranged in the moulded body, which is configured to convert primary radiation generated in the device completely or at least partially into secondary radiation with a peak wavelength different from the primary radiation.

According to at least one embodiment of the device, the device comprises a plurality of semiconductor chips which are configured to generate radiation. For example, the semiconductor chips are formed as luminescent diode chips, in particular as light emitting diode chips. The radiation to be generated lies, for example, in the ultraviolet, visible or infrared spectral range.

For example, the semiconductor chips have two contacts provided for the external electrical contacting, wherein the contacts are accessible on the same side of the semiconductor chip, for example a front-side of the semiconductor chip. A rear-side of the semiconductor chip is in particular free of electrical contacts. For example, the semiconductor chips each have an epitaxially deposited semiconductor body which is arranged on a substrate, for example a growth substrate for epitaxial deposition.

According to at least one embodiment of the device, the semiconductor chips are arranged on the front-side of the moulded body and each of the semiconductor chips overlap with the moulded body in plan view of the device. For example, the semiconductor chips are arranged completely on the moulded body and in particular are fixed to it. In particular, there is no part of the lead frame between the moulded body and the semiconductor chips when viewed in the vertical direction. The semiconductor chips can be arranged completely without overlapping with the lead frame.

Alternatively, the semiconductor chips can, for example, be arranged in places on the moulded body and in places on the lead frame and, in particular, be fixed. In other words, the semiconductor chips overlap with the moulded body and the lead frame in places.

In particular, the semiconductor chips can be attached to the front-side of the moulded body. Viewed in the vertical direction, only a connecting layer, for example an adhesive layer for fixing the semiconductor chips to the moulded body, is located between the front-side of the moulded body and the semiconductor chips.

The front-side is considered to be that side of the moulded body which faces the semiconductor chips. In vertical direction, the moulded body extends between the front-side and a rear-side opposite the front-side.

In at least one embodiment of the device, the device comprises a lead frame, a moulded body and a plurality of semiconductor chips configured to generate radiation. The lead frame has two connection parts for external electrical contacting of the device. The moulded body is formed to the lead frame. The moulded body is transmissive to the radiation generated during operation of the device. The semiconductor chips are arranged on a front-side of the moulded body and overlap with the moulded body in plan view of the device.

In lateral direction, the device is delimited along a main direction of extension by two end surfaces, wherein in particular a respective connection part form an end surface.

According to at least one embodiment of the device, the moulded body and the lead frame terminate flush with a side surface of the device. The side surface of the device runs obliquely or perpendicularly to the main plane of extension of the moulded body. The side surface of the device is created during the production of the device, in particular in a separation step in which the device is separated from a composite. The side surface can therefore have characteristic traces from the separation step, for example traces of a mechanical process, such as a sawing process or an etching process, or traces of material removal by coherent radiation, for example by a laser separation process.

According to at least one embodiment of the device, the lead frame has at least one anchoring structure in which the moulded body meshes. For example, each connection part has an anchoring structure. For example, the anchoring structure has one or more indentations. This simplifies a permanent mechanically stable connection between the moulded body and the lead frame.

According to at least one embodiment of the device, at least one semiconductor chip or at least two semiconductor chips, in particular all semiconductor chips, are arranged along the main direction of extension of the device between the first connection part and the second connection part. In other words, at least one semiconductor chip, at least two semiconductor chips or all semiconductor chips are located in an interspace between the first connection part and the second connection part. In particular, at least one semiconductor chip, at least two semiconductor chips or all semiconductor chips can be arranged completely without overlapping with the lead frame in plan view of the device.

According to at least one embodiment of the device, at least one connection part runs along the main direction of extension of the device along an entire side surface of at least one semiconductor chip of the plurality of semiconductor chips. Both connection parts can also run along the side surface of at least one semiconductor chip. In particular, one of the connection parts can also run along all side surfaces of the semiconductor chips of the device.

In plan view of the device, the at least one connection part runs laterally spaced apart from the side surface of the semiconductor chip and without overlapping with the semiconductor chip.

According to at least one embodiment of the device, at least one connection part has at least one recess, wherein the recess overlaps with at least one semiconductor chip of the plurality of semiconductor chips. During operation of the device, radiation of the semiconductor chip, which overlaps with the recess, can emit radiation through the recess of the connection part. In particular, the recess is completely surrounded by material of the connection part in the lateral direction.

According to at least one embodiment of the device, the semiconductor chip is arranged completely within the recess in plan view of the device. The entire radiation emitted perpendicularly from the semiconductor chip in the direction of the moulded body can therefore pass through the recess in the connection part and enter the latter, for example, via the front-side of the moulded body.

According to at least one embodiment of the device, the semiconductor chip overlaps with the recess and the lead frame in plan view of the device. An overlap between the semiconductor chip and the lead frame can result in an improved heat dissipation of the semiconductor chip via the lead frame.

According to at least one embodiment of the device, the device has a front-side cover on the front-side of the moulded body. For example, the front-side cover, the moulded body and the lead frame terminate flush with at least one side surface of the device. In particular, the front-side directly adjoins the semiconductor chips and can extend continuously over all semiconductor chips of the device. In particular, the cover can completely cover the moulded body in plan view of the device. For example, the front-side cover is arranged only on the front-side of the moulded body and does not cover a side surface or a rear-side of the moulded body at any point.

A part of the connection parts protrudes in lateral direction beyond the front-side cover.

According to at least one embodiment of the device, the device has a rear-side cover on the rear-side of the moulded body opposite the front-side. In particular, the front-side cover and the rear-side cover do not directly adjoin one another at any point.

The front-side cover and/or the rear-side cover, in particular the front-side cover and the rear-side cover, can have a radiation conversion material.

The front-side cover and the rear-side cover are expediently transmissive to the radiation generated in the semiconductor chips.

According to at least one embodiment of the device, at least one further semiconductor chip of the plurality of semiconductor chips is electrically conductively connected to the connection parts only via an end-side semiconductor chip of the plurality of semiconductor chips. For example, only precisely one semiconductor chip is directly electrically conductively connected to each connection part, for example by means of a wire bond connection. A direct connection between two points of the device is understood to be an electrical connection which has such a low electrical resistance that no substantial voltage drop occurs between these two points during operation of the device, for example in the case of an electrically conductive connection via a metallic conductor, for example a wire bond connection.

For example, at least one semiconductor chip of the device is directly connected via wire bond connections to two semiconductor chips which are adjacent to the semiconductor chip, in particular on opposite sides of the semiconductor chip. The lead frame thus does not serve for the direct electrically conductive connection to all semiconductor chips of the device.

According to at least one embodiment of the device, a radiation conversion material is arranged between a rear-side of the semiconductor chips facing the moulded body and a rear-side of the device. For example, the radiation conversion material is arranged in the moulded body and/or in the rear-side cover and/or in a coating of the moulded body or the rear-side cover.

According to at least one embodiment of the device, the device is an LED filament. For the external electrical contacting of the device in a glass bulb, the LED filament is formed in particular spot-weldable.

Furthermore, a method for producing a plurality of devices is specified.

According to at least one embodiment of the method, a lead frame with a plurality of device regions is provided. The lead frame is formed with an in particular radiation-transmissive moulding material, for example by a moulding process to form a moulded body composite. For example, the moulded body composite can be formed by injection moulding, compression moulding, injection moulding or film assisted injection moulding. A plurality of semiconductor chips configured to generate radiation are arranged on the moulded body composite. An electrically conductive connection is produced between the semiconductor chips and the lead frame. The moulded body composite is separated into the plurality of devices between adjacent device regions, wherein the devices each comprising a part of the lead frame, a part of the moulded body composite as a moulded body, and a plurality of semiconductor chips.

The method is preferably carried out in the order specified in the above enumeration. In particular, the separation is the final method step so that all previous method steps can be produced in a composite. The electrically conductive connection to the lead frame is produced, in particular, only after the semiconductor chips have been attached to the moulded body composite and before the separation.

The moulded bodies on which the semiconductor chips of the device are arranged are created, in particular, only from the moulded body composite in the separating step. The semiconductor chips therefore do not have to be arranged on prefabricated, for example strip-shaped substrate bodies.

According to at least one embodiment of the process, the lead frames and the moulded body composite are severed during the separation. The lead frame and the moulded body composite form in places a side surface of the device being created during the separation process.

According to at least one embodiment of the process, between the production of an electrically conductive connection between the semiconductor chips and the lead frame and the separation of the moulded body composite, a front-side cover is applied which adjoins the plurality of semiconductor chips. In particular, the front-side cover is severed during separation. The front-side cover is applied by means of a moulding process, for example.

The method described is particularly suitable for producing a device described above. Features described in connection with the device can therefore also be used for the method and vice versa.

In particular, the following effects can be achieved with the device or the method.

The devices can be produced with the same process flow as other components which also have a lead frame, for example surface mountable components. In particular, the production of the device can be carried out completely in a composite, so that no further method step is required after the separation step in which the moulded bodies are produced. After the separation, the devices can be in the form of loose material.

At the same time, the lead frame is formed in such a way that it does not or not significantly hinder the emission of radiation towards the rear-side of the device. As a result, a comparatively omnidirectional emission can be achieved as in the case of a filament, in which the LEDs are arranged on a glass, sapphire or ceramic substrate.

Furthermore, heat dissipation from the semiconductor chips during operation of the device can be improved by means of the lead frame.

In the case of LED filaments, the heat dissipation takes place, unlike for example surface-mountable components, not via a mounting surface, such as a printed circuit board, but via convection and radiation over the entire surface of the LED filament. It has been shown that the described arrangement of semiconductor chips, moulded bodies and lead frames in such LED filaments and other devices, in which the heat dissipation takes place via their surface, can cause a sufficient heat dissipation and long-term stability, such as stability of the moulded body against the radiation of the semiconductor chips.

Further features, embodiments and expediencies result from the following description of the exemplary embodiments in connection with the Figures.

Figure 5A:
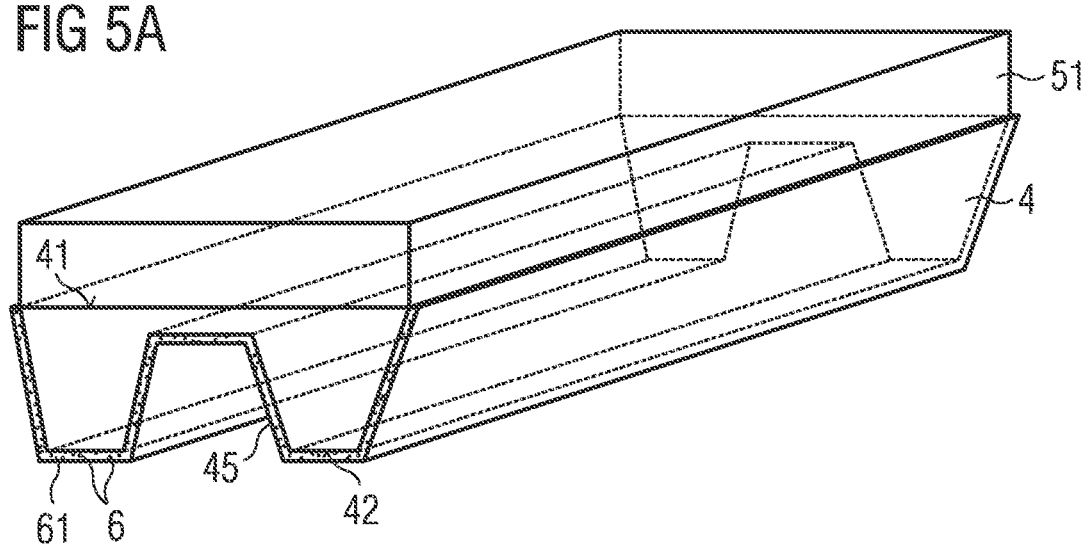
Figure 5B:
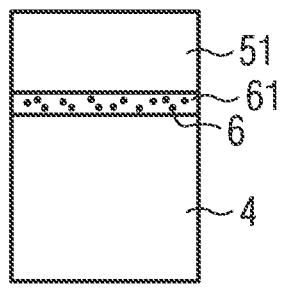
Figure 5C:
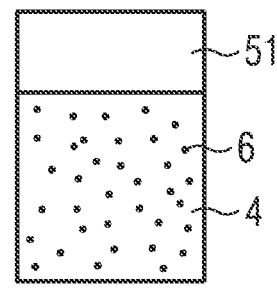

They show:

FIGS. 1, 2, 3 and 4 each show an exemplary embodiment of a device in a perspective view of a section of the device;

FIGS. 5A, 5B and 5C each show an exemplary embodiment of a device in a perspective schematic representation (FIG. 5A) and two sectional views of a section (FIGS. 5B and 5C); and FIGS. 6A to 6G show an exemplary embodiment of a method for producing devices by means of intermediate steps in perspective view, each of which is represented schematically.

Identical, similar or similarly acting elements are provided with the same reference signs in the Figures.

The Figures and the proportions of the elements represented in the Figures are not to be regarded as true to scale. Rather, individual elements and in particular layer thicknesses may be shown in exaggerated size for better representability and/or understanding.

FIG. 1 shows a section of a device in perspective view, wherein the section shows a connection part 31 of a lead frame 3 of the device. Along a main direction of extension in lateral direction, the device 1 extends between an end surface 17 of a connection part 31 and an opposite connecting surface of a further connection part. The opposite connection parts 31 of device 1 are shown in FIG. 6G.

The device 1 also has a moulded body 4, which is formed to the lead frame 3. To promote a toothing between the moulded body and the lead frame 3, the connection part 31 has an optional anchoring structure 35. The anchoring structure runs along an edge of the connection part 31 and is exemplarily formed by a plurality of indentations 350 in the connection part 31. However, the anchoring structure can also, for example, be formed as a breakthrough through the connection part which is enclosed by the connection part along the entire circumference. Alternatively or in addition, an anchoring structure can be formed, for example, by a semi-etched lead frame 3, so that the lead frame 3 has an undercut in a side view, for example.

In vertical direction, the moulded body 4 extends between a front-side 41 and a rear-side 42. A plurality of semiconductor chips 2 are arranged on the front-side, each of which is configured to generate radiation.

In plan view of the device 1, i.e. in a view of the front-side 11 of the device, a plurality of semiconductor chips 2 are arranged on the moulded body 4 and each of the semiconductor chips are arranged without overlapping with the lead frame 3.

The semiconductor chips 2 are formed in particular as light-emitting diode semiconductor chips which emit radiation through both a front-side 21 and a rear-side 22 of the semiconductor chip.

An end-side semiconductor chip 2a nearest to the connection part 31 is directly connected to the connection part 31 by means of a connecting line 7.

The further semiconductor chips 2b are each electrically conductively connected to two adjacent semiconductor chips via a connecting line 7, for example in the form of a wire bond connection. All in all, this results in a series connection of all semiconductor chips 2 of the device 1 between the two connection parts 31. By applying an external electrical voltage between the connection parts 31, an electrical current is impressed and leads to the generation of radiation in the semiconductor chips, in particular in the visible spectral range, for example in the blue or ultraviolet spectral range.

All semiconductor chips 2 of the device are arranged along the main direction of extension of the device in plan view of the device between the connection parts 31.

The contacts of the semiconductor chips 2 are each arranged on a front-side 21 facing away from the moulded body 4. A rear-side 22 of the semiconductor chips opposite the front-side 21 is free of electrical contacts.

The device 1 also has a front-side cover 51 on the front-side 41 of the moulded body 4. The front-side cover is directly adjacent to the semiconductor chips 2 and the connecting line 7. At the rear-side of the moulded body, the device 1 has a rear-side cover 52. The front-side cover and the rear-side cover are not directly adjacent to one another at any point.

On one side surface 15 of the device 1 the lead frame 3, the moulded body 4, the front-side cover 51 and the rear-side cover 52 terminate flush with one another. The elements mentioned thus form the side surface of the device. The side surface 15 can have characteristic traces of the separation process by which the device 1 is separated from a composite, for example traces of a sawing process, traces of chemical material removal or traces of material removal by coherent radiation.

A radiation conversion material 6 is embedded in the front-side cover 51 and the rear-side cover 52. The radiation conversion material is configured to convert primary radiation generated by the semiconductor chips, for example radiation in the blue or ultraviolet spectral range, at least partially into secondary radiation with a peak wavelength different from the primary radiation, for example in the yellow and/or red spectral range, so that the device as a whole radiates light which appears white to the human eye, for example.

The front-side cover 51 and the rear-side cover 52 each directly adjoin the moulded body 4, in particular on opposite sides of the moulded body.

In FIG. 1, the radiation conversion material 6 is only drawn in a region of the front-side cover 51 and in a region of the rear-side cover 52 for the sake of simplicity. The radiation conversion material extends largely homogeneously mixed within the front-side cover 51 and the rear-side cover 52.

The front-side cover 51 forms a front-side 11 of the device. The rear-side cover 52 forms a rear-side 12 of the device 1. During operation of the device, the mixed radiation emitted by the semiconductor chips 2 and the radiation conversion material 6 emerges through the front-side 11 and the rear-side 12 of the device 1. In the exemplary embodiment shown in FIG. 1, the front-side cover 51 and the rear-side cover 52 have a convex curved shape at the front-side 11 and the rear-side 12 respectively. In this way, a homogeneous radiation can be achieved in a simplified manner.

The lead frame 3, for example, is formed from a metal sheet. For example, the lead frame contains copper or stainless steel. Stainless steel is characterised by a simple spot weldability, so that the connection parts 31 can be connected easily and reliably by spot welding mechanically stable and electrically conductive.

Preferably, at least one front-side of the lead frame 3 facing the semiconductor chips 2 is provided with a coating at least in places. As a result, the production of a wire bond connection can be achieved in a simplified manner. For example, the coating has silver. Such a coating can also increase the reflectivity of the lead frame. It can also be advantageous to provide the lead frame 3 with such a coating on both sides.

The connection parts 31 can be formed in such a way that they can be produced simply by punching from a metal sheet during the production. Alternatively, more complex structures can be used, for example in the form of an etched lead frame or a double etched lead frame to form edges in a side view of the device. The mechanical connection between the lead frame and the moulded body 4 can thus be further improved.

The moulded body 4 contains in particular an electrically insulating material, for example a plastic material. Preferably the plastic material can be processed by means of a moulding process. For example, the plastic material contains an epoxy resin, a silicone, a thermoplastic or a duroplast. Such materials can have a sufficient mechanical stability and hardness to achieve the formation of connecting lines 7 for example by wire bonding.

A base material of the moulded body preferably exhibits the lowest possible absorption, so that the base material in the layer thickness used absorbs less than 20%, and particularly preferably less than 5%, of the incident light, for example of the incident blue or white light, when the radiation passes vertically. The moulded body 4 can also function to scatter light. Preferably the transmission through the moulded body 4 is at least 30%, particularly preferably at least 70%. To improve thermal conductivity, the moulded body can contain admixed particles. Glass or cristalobalite, for example, is suitable because these materials have a similar refractive index as the materials suitable for the moulded body 4. Cristobalite is characterized by a particularly high thermal conductivity, so that waste heat generated in the semiconductor chips 2 during operation of the device 1 can be efficiently dissipated via the moulded body 4. However, other materials can also be used, for example, aluminium oxide or titanium oxide. Expediently, the particles have no absorbing effect on the radiation to be generated by the device 1.

For example, the particles have a diameter between 5 μm and 50 μm inclusive, and in particular between 10 μm and 30 μm inclusive. Particles in this size range cause a comparatively low light scattering and can also be reliably processed with moulding processes.

The moulded body 4 can also has a radiation conversion material, in particular as an alternative or in addition to the radiation conversion material in the rear-side cover 52.

For the front-side cover 51 and the rear-side cover 52, preferably also a material which can be processed by a moulding process is used.

In the exemplary embodiment shown in FIG. 1, the moulded body 4 has a greater vertical extent than the lead frame 3. At the front-side 41 of the moulded body 4, the moulded body and the lead frame 3 terminate flush. This ensures in a simple manner that the lead frame at the front-side of the moulded body can be achieved the connecting line between the connection part 31 and the nearest end-side semiconductor chip 2a. The greater vertical extension of the moulded body 4 ensures in a simple manner that during the production of the moulded body 4 between two flat surfaces of a casting mould a continuous gap is created between the casting mould and the rear-side of the lead frame 3. The production by an injection moulding process is thus simplified.

The device 1 is particularly suitable as an LED filament for reproducing a filament in a conventional light bulb. The device can be produced using typical processes for the production of lead frame based designs of light-emitting components, especially surface-mountable components. Furthermore, the device is characterized by an omnidirectional radiation and is therefore particularly suitable for the replication of a filament. In principle, however, the design of the device is also suitable for other applications, in particular for devices which are also configured to emit radiation on their rear-side and/or whose heat loss during operation is to be dissipated over the entire surface of the device and not only over the rear-side of the device.

Figure 2:
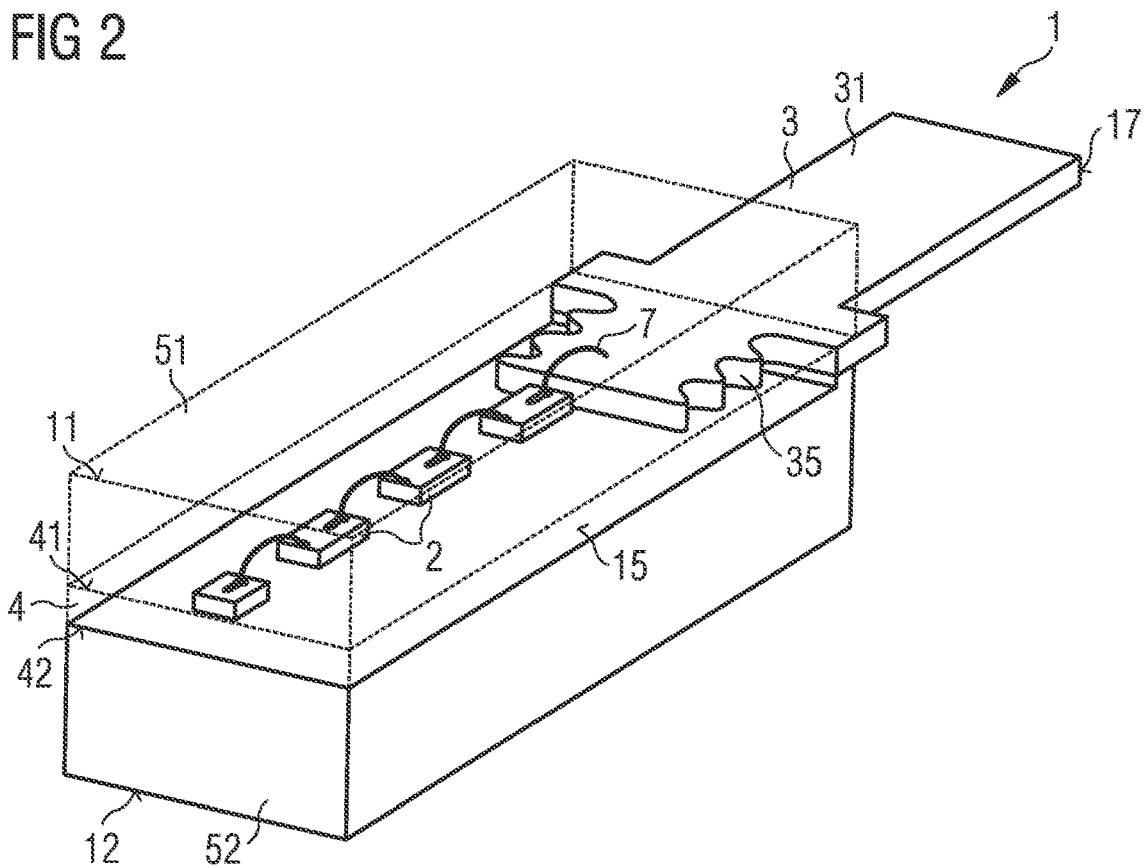

FIG. 2 shows a further exemplary embodiment of a device. This device corresponds substantially to the device described in the context of FIG. 1. In contrast, the front-side 11 and the rear-side 12 of the device 1 are formed flat. The front-side cover 51 and the rear-side cover 52 therefore each have a basic cuboid shape. For the production of such covers, particularly simple flat casting moulds can be used.

For example, a vertical extension of the front-side cover 51 and/or the rear-side cover 52 is between 200 μm and 1000 μm inclusive. The entire side surface of the front-side cover 51 and the rear-side cover 52 is only created when the composite in which the device is produced is separated.

Figure 3:
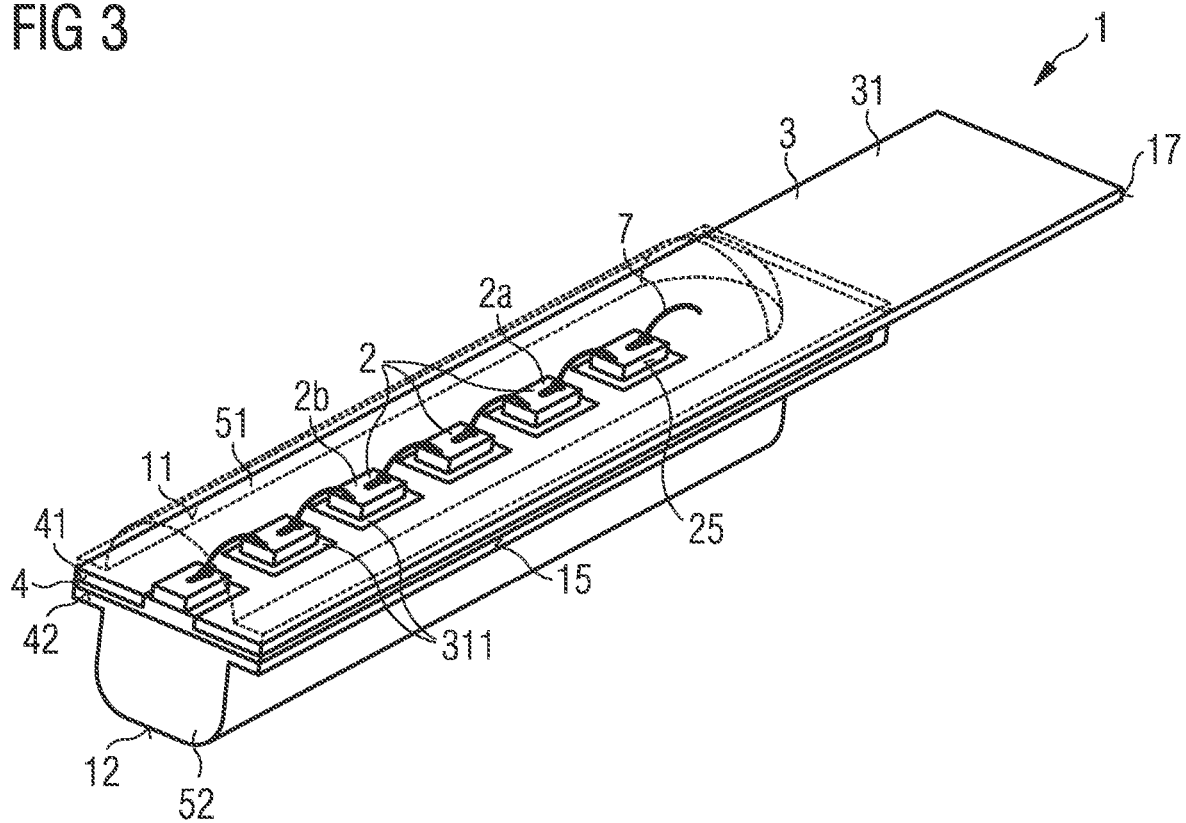

A further exemplary embodiment of a device is shown in FIG. 3. This exemplary embodiment corresponds substantially to the exemplary embodiment described in connection with FIG. 1.

In contrast, the connection part 31 has a plurality of recesses 311. The recesses are each surrounded along their entire circumference by material from the connection part 31. The semiconductor chips 2 are each positioned overlapping with the recesses 311, in particular completely, within the recesses 311. The semiconductor chips 2 are thus arranged without overlapping with the lead frame 3.

During the operation of the device 1, the semiconductor chips 2 can radiate radiation into the moulded body 4 through their rear-side 22. The connection part 31 runs along the side surfaces 25 of one or more semiconductor chips 2 in a plan view of the device 1, in particular without overlapping with the semiconductor chips.

The semiconductor chips 2 are thus located closer to the lead frame 3, so that a heat dissipation via the lead frame 3 can take place with greater efficiency. Such an embodiment is particularly advantageous if a reduced radiation of the device 1 through the rear-side 12 is desired or at least acceptable.

The recesses 311 are completely filled with the moulded body 4. Also in this exemplary embodiment, only the end-side semiconductor chip 2a is directly connected to the lead frame 3 via a connecting line 7. The further semiconductor chips 2b are each only indirectly connected to the lead frame via the adjacent semiconductor chips.

As described in connection with FIG. 1, the moulded body 4 covers the rear-side of the lead frame 3 over a large area. A reliable filling of the recesses 311 can thus be achieved in a simple manner. In the exemplary embodiment shown, the lead frame 3 can extend continuously along the main direction of extension over the entire device 1, apart from a gap between the connection parts 31 required for electrical insulation. Even for semiconductor chips 2, which are located comparatively far away from the end surface 17, a particularly efficient heat dissipation during operation of the device can be achieved in this way.

Figure 4:
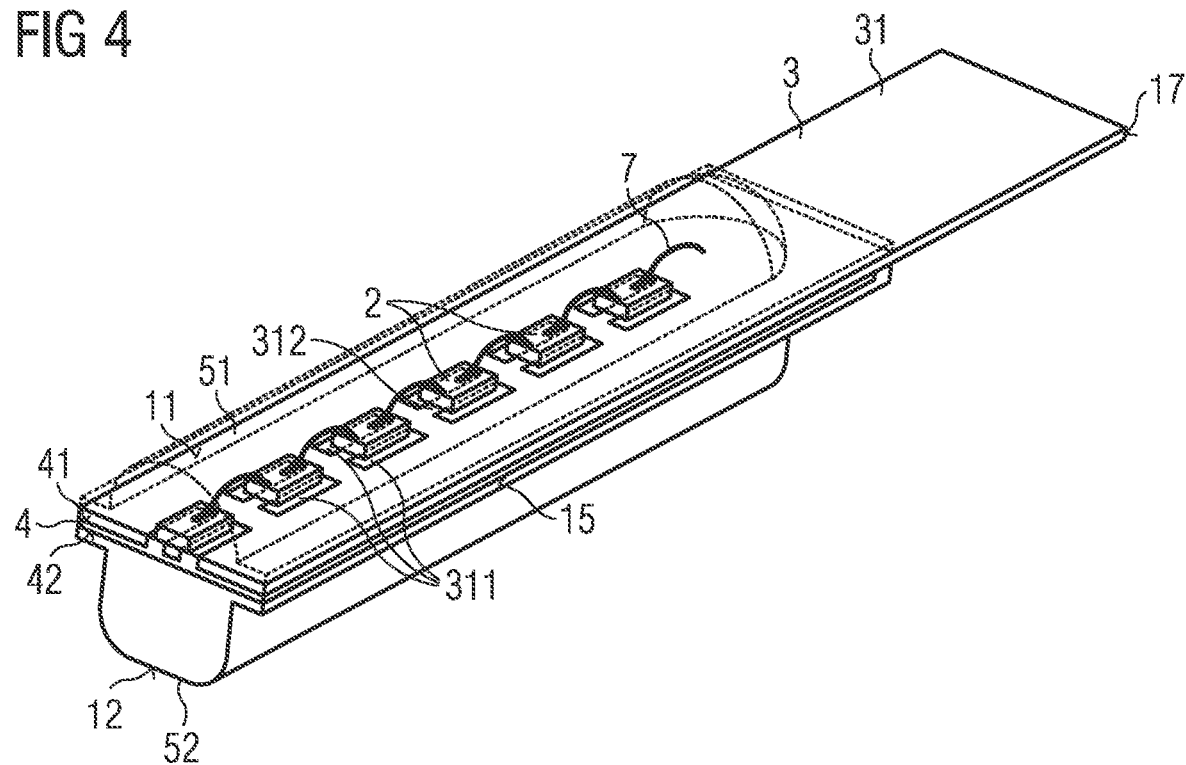

A further exemplary embodiment of a device is shown in FIG. 4. This exemplary embodiment substantially corresponds to the exemplary embodiment described in connection with FIG. 3.

In contrast, the semiconductor chips 2 overlap with the lead frame 3 in plan view of the device. The connection part 31 has recesses 311 for each semiconductor chip 2. Between two recesses 311, which are assigned to a semiconductor chip 2, runs a bar 312 of the connection part 31. This bar overlaps with the semiconductor chip 2 in plan view of the device and causes a particularly efficient heat dissipation from the semiconductor chip. Only a part of the surface of the semiconductor chips 2 is thus seated on the radiation-transmissive moulded body 4, while a further part is seated on the connection part 31. Such an embodiment is particularly advantageous if a resulting reduced radiation through the rear-side 12 of the device is acceptable.

FIGS. 5A, 5B and 5C show embodiments of details of the device which can also be used for the exemplary embodiment described above. Details of the device already described in connection with the previous exemplary embodiments are not explicitly shown in these exemplary embodiments for simplified representation, but can be used likewise.

In the exemplary embodiment shown in FIG. 5A, the moulded body 4 has a depression 45 on its rear-side 42. With such a depression, the surface area of the moulded body 4 is increased so that the heat dissipation from the moulded body 4 can be more efficient. In the exemplary embodiment shown, the depression forms cooling fins running along the main direction of extension. Alternatively or in addition, cooling fins can also be used perpendicular to it. The depression 45 can also be used to shape the radiation.

In this exemplary embodiment, the radiation conversion material 6 is in the form of a coating 61, wherein the coating 61 is covering the rear-side 42 of the moulded body 4. Such a coating can be applied by a spraying process, for example. As a result, a homogeneous thin layer with radiation conversion material 6 can also be easily and reliably formed on a structured rear-side of the moulded body 4. Such a structuring of the moulded body 4 can be used for all the above-mentioned exemplary embodiments.

Even in the exemplary embodiment shown in FIG. 5A, the rear-side 45 of the moulded body 4 can be provided with a rear-side cover.

FIG. 5B shows an alternative embodiment of the radiation conversion material 6. In this exemplary embodiment, the coating 61 with the radiation conversion material is arranged between the moulded body 4 and the front-side cover 51. By means of a coating arranged at this point, a part of the radiation generated by the semiconductor chips 2 is already converted into secondary radiation before the radiation enters the moulded body 4. In particular, radiation with comparatively high energy, such as radiation in the blue spectral range or in the ultraviolet spectral range, can thus be reduced before entering moulded body 4 in favour of a higher proportion of already converted radiation with lower energy, so that radiation-induced aging of the moulded body can be reduced.

Such an arrangement of the radiation conversion material can also be applied to the other coating described above.

FIG. 5C shows a further alternative arrangement of the radiation conversion material. In this exemplary embodiment, the radiation conversion material 6 is embedded in the moulded body 4. This arrangement is also applicable to the exemplary embodiment described above. In this case, the rear-side cover 52 can have additional radiation conversion material 6 or be free of radiation conversion material 6. Furthermore, the rear-side cover 52 can also be completely dispensed with.

Figure 6A:
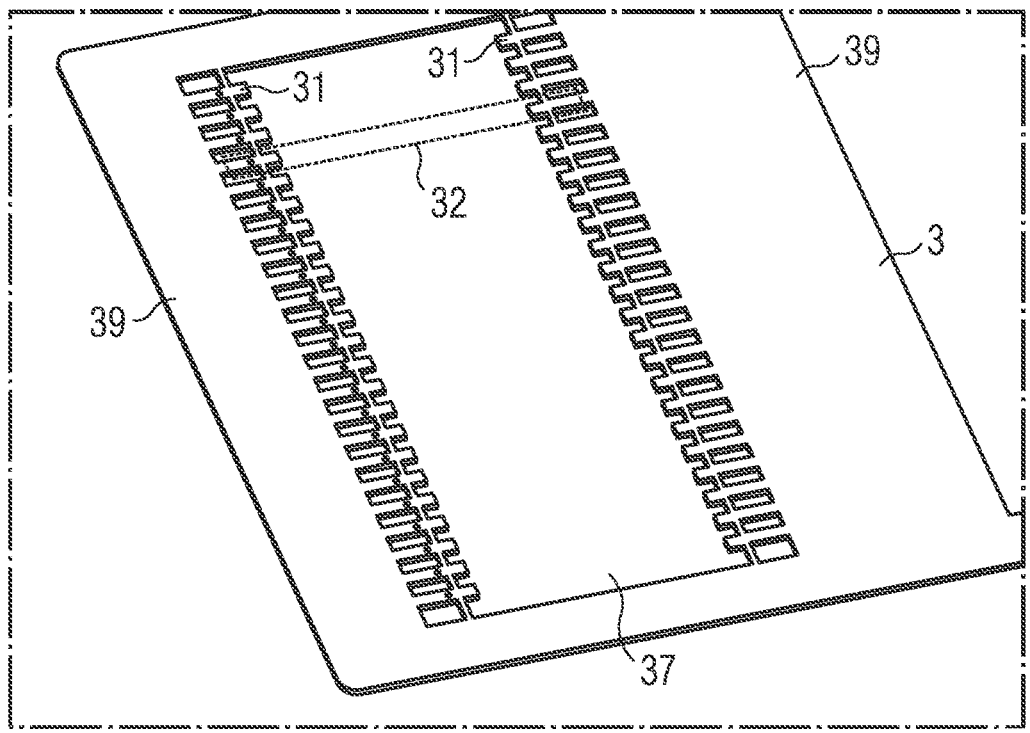
Figure 6B:
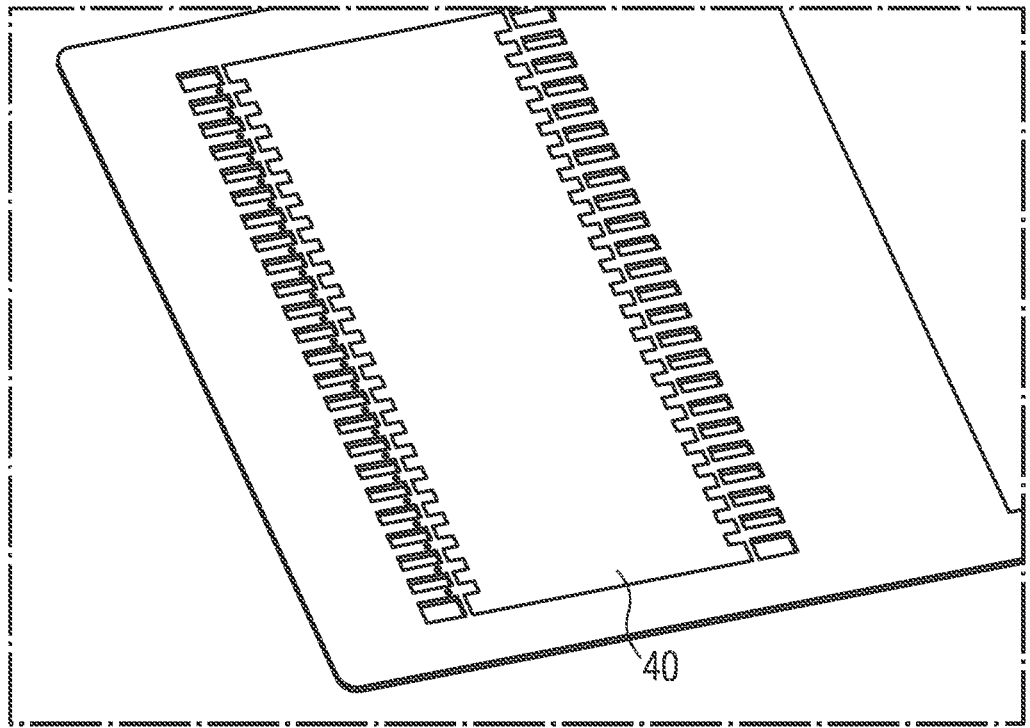
Figure 6C:
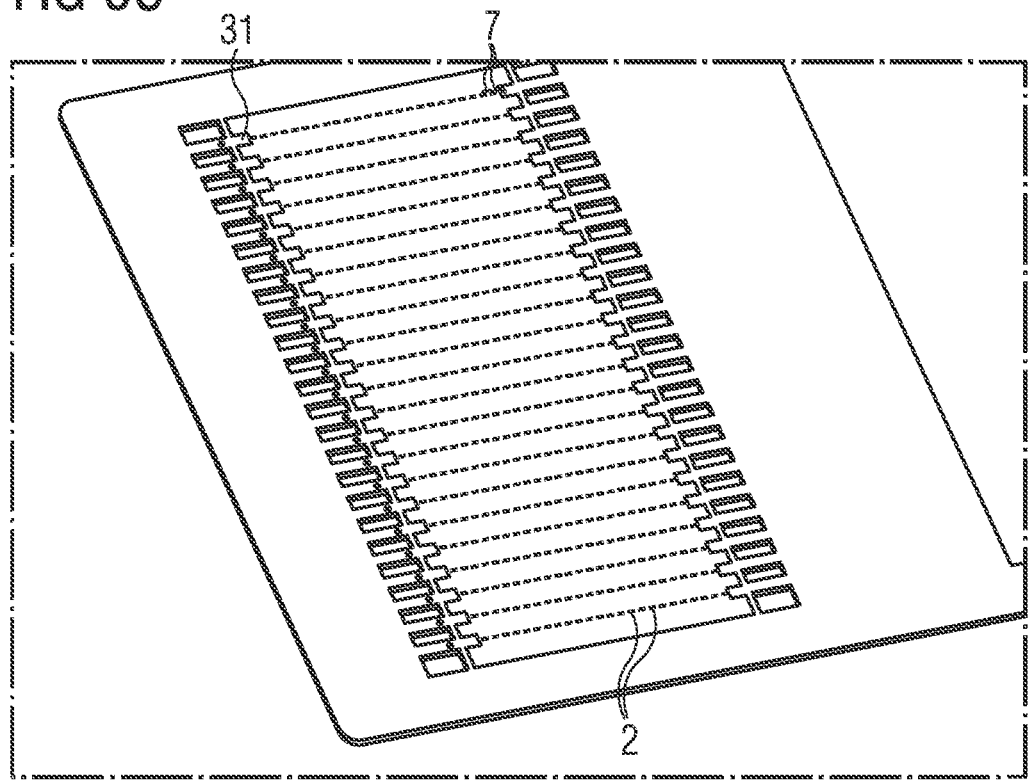
Figure 6D:
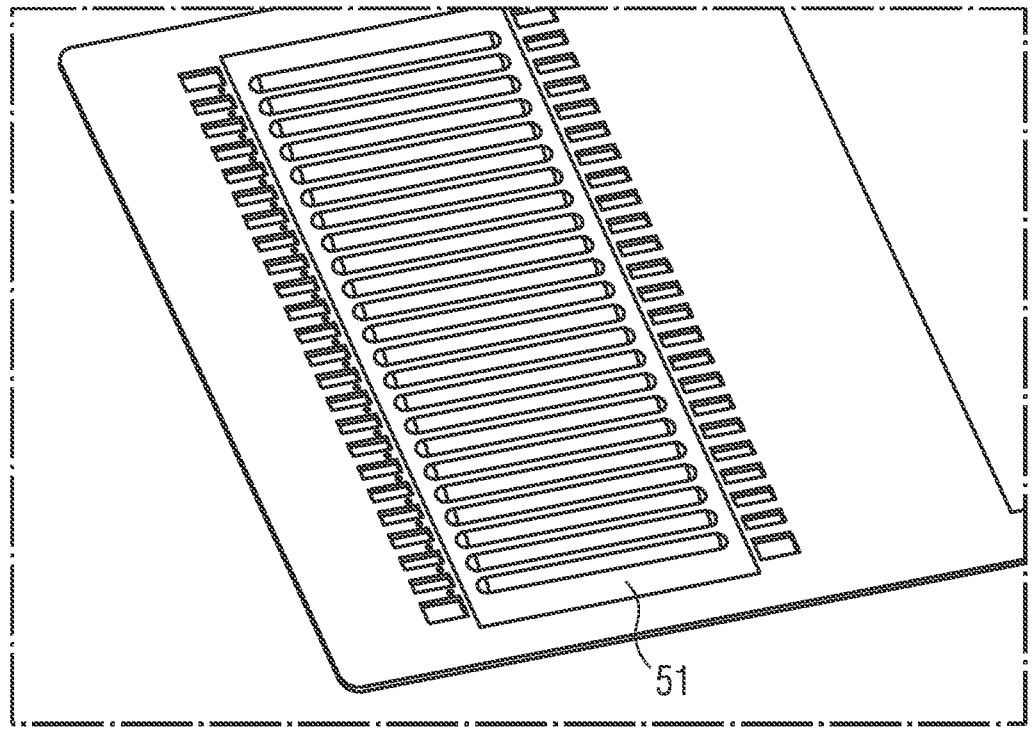
Figure 6E:
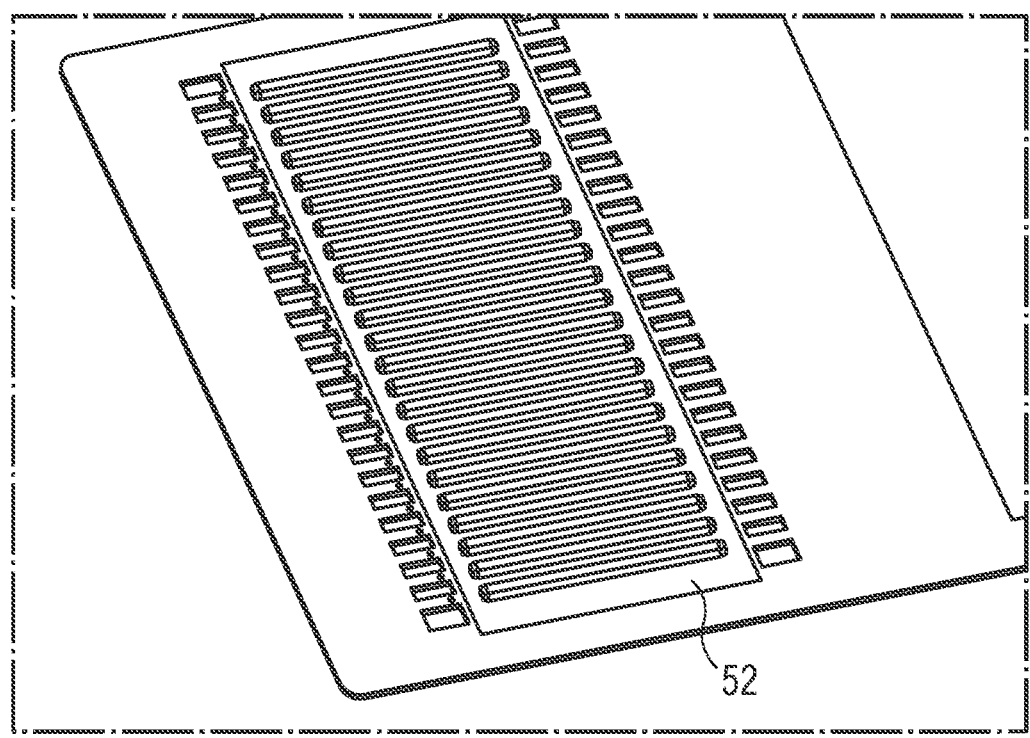
Figure 6F:
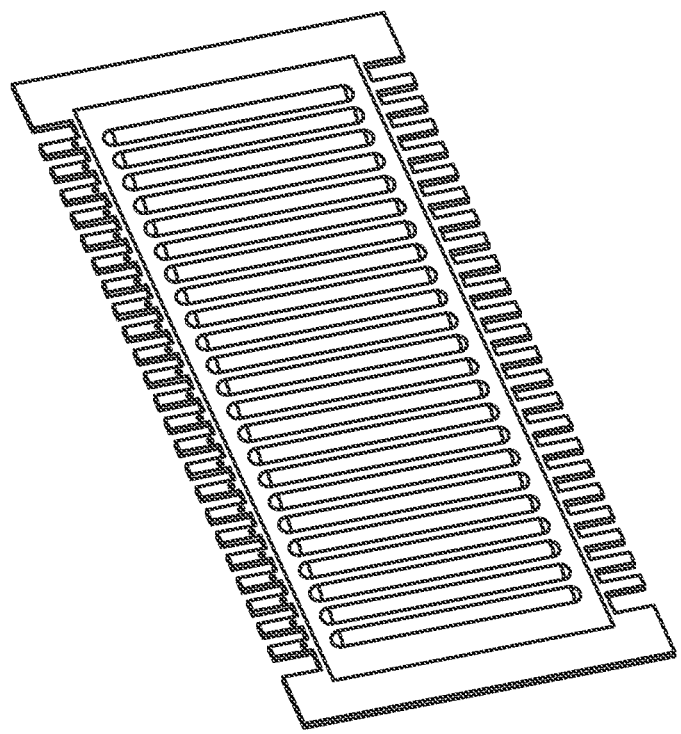
Figure 6G:
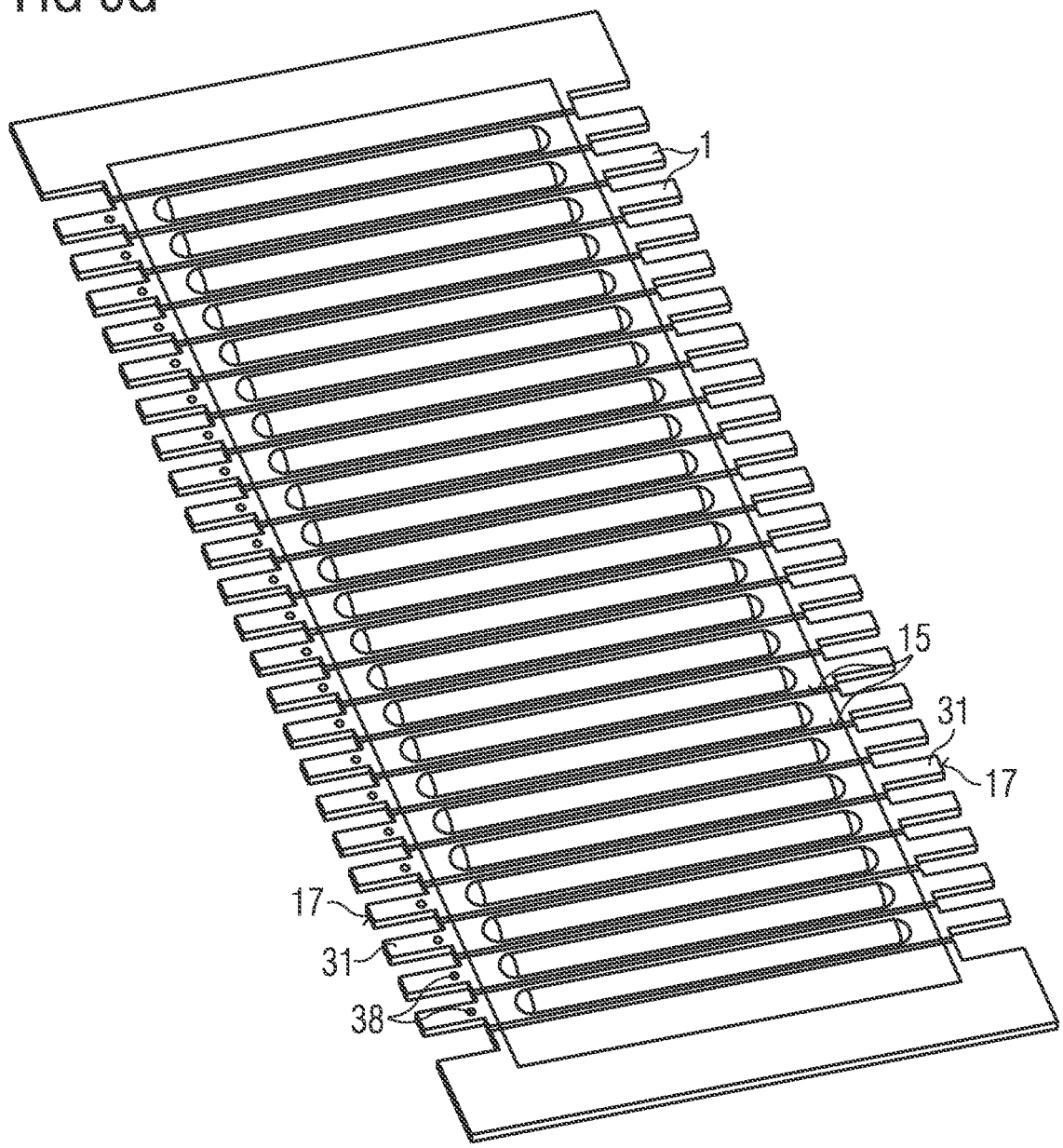

An example of a method for producing a plurality of devices is shown in FIGS. 6A to 6G, wherein FIGS. 6A, 6B, 6C, 6D, 6F and 6G each represent a plan view of the front-side of the device and FIG. 6E represents a plan view of the rear-side of the device.

For the sake of simplified illustration, in the Figures, only the elements are provided with reference signs, which are newly added in the respective stage of the method and/or are described in connection with this stage.

As shown in FIG. 6A, a lead frame 3 is provided. The lead frame has a plurality of device regions 32, each of which is configured for producing a device. Each device region 32 has two connection parts 31. An opening 37 is formed in the lead frame between the connection parts 31, for example by punching. On the side of the connection parts 31 facing away from the opening 37, the lead frame has a gain region 39 in each case. This gain region is configured to increase the mechanical stability of the lead frame 3 during the subsequent method steps.

The opening 37 is filled with a moulding material as shown in FIG. 6B to produce a moulded body composite 40. This is performed by means of a moulding process, for example. A compression moulding process is particularly suitable, in which the moulding material is injected at high pressure into a previously closed casting mould. The continuous channels required for this are provided over a large area on the rear-side of the lead frame, as described in connection with FIG. 1. Alternatively, however, another moulding process can be used, for example an injection moulding process in which the moulding material is first injected in liquid form into an open mould and then brought into the final shape by closing the mould.

A plurality of semiconductor chips 2 are applied to the moulded body composite 40, for example by means of adhesive bonding. The semiconductor chips 2 are electrically connected to one another and to the lead frame 3 by means of connecting line 7. FIG. 6C shows only two connecting lines 7 for a simplified representation. All semiconductor chips 2 of a device region are electrically connected in series to one another between two connection parts 31. At this point the semiconductor chips 2 are still short-circuited via the interconnected lead frame 3.

A front-side cover is applied to the front-side of the moulded body composite 40 (FIG. 6D). The front-side cover 51 is directly adjacent to the semiconductor chips 2 and the moulded body composite 40. In addition, the front-side cover 51 also encloses the connecting lines 7. The front-side cover 51 extends continuously over several, especially all, device regions.

In a subsequent step, a rear-side cover 52 is formed at the rear-side of the moulded body composite (FIG. 6E). The front-side cover 51 and the rear-side cover 52 can each be applied by a moulding process. In particular, the front-side cover and the rear-side cover are not directly adjacent at any point.

After completion of the moulding process, the gain region 39 shown in FIG. 6A can be removed (FIG. 6F). By a separation parallel to a main direction of extension of the individual device regions 32, the separated devices 1 are produced (FIG. 6G). During separation, the lead frame 3 and the moulded body 40 and, if necessary, the front-side cover 51 and the rear-side cover 52 are severed. The separation is carried out by a mechanical process such as sawing.

The devices produced in this way can be made available for further processing, especially as loose material. For a reliable identification of the polarity of the individual devices 1, the lead frame 3, in particular a connection part 31 of the lead frame, can have a marking 38, for example in the form of a recess in the connection part.

The method is only shown exemplarily for producing devices which are embodied as described in connection with FIG. 1. By making minor adjustments to the method, it is also possible to produce devices according to the other exemplary embodiments.

With the described method, in particular devices in the form of LED filaments or other omnidirectional emitting devices can be produced in a simple and reliable way by a method that substantially uses method steps that are also used in the production of other lead frame-based designs of light-emitting components.

In particular, all method steps can be produced in a composite. In contrast to conventional LED filaments, the semiconductor chips are not placed on individual, prefabricated strip-shaped carriers, but on a continuous moulded body composite for a plurality of devices. The moulded bodies 4 of the future devices are only created when the moulded body composite is separated. After the final separation step, no further method steps are required for the device 1.

The priority of the German patent application DE 102017122410.6 is claimed, the disclosure of which is hereby explicitly included by reference.

The invention is not limited by the description based on the exemplary embodiments. Rather, the invention comprises every new feature as well as every combination of features, which in particular includes every combination of features in the claims, even if this feature or this combination itself is not explicitly stated in the claims or the exemplary embodiments.

REFERENCE SIGNS LIST 1 device
11 front-side of the device
12 rear-side of the device
15 side surface of the device
17 end surface of the device
2 semiconductor chip
2a end-side semiconductor chip
2b further semiconductor chip
21 front-side
22 rear-side
25 side surface
3 lead frames
31 connection part
311 recess
312 bar
32 device region
35 anchoring structure
350 indentation
37 opening
38 marking
39 gain region
4 moulded body
40 moulded body composite 41 front-side of the moulded body composite
42 rear-side of the moulded body composite
45 depression
51 front-side cover
52 rear-side cover
6 radiation conversion material
61 coating
7 connecting line

The invention claimed is:

1. A device with a lead frame, a moulded body and a plurality of semiconductor chips configured to generate radiation, wherein
the lead frame has two connection parts for external electrical contacting of the device;
the moulded body is formed to the lead frame;
the moulded body is transmissive to the radiation generated during operation of the device;
the semiconductor chips are arranged on a front-side of the moulded body and each of the semiconductor chips overlap with the moulded body in plan view of the device;
the device has a front-side cover on the front-side of the moulded body;
the device has a rear-side cover on a rear-side of the moulded body opposite the front-side; and
at least one connection part runs along a main direction of extension of the device along an entire side surface of at least one semiconductor chip of the plurality of semiconductor chips.

2. The device according to claim 1, wherein the moulded body and the lead frame terminate flush with a side surface of the device.

3. The device according to claim 1, wherein the moulded body and the lead frame terminate flush with the front-side of the moulded body.

4. The device according to claim 1, wherein the lead frame has at least one anchoring structure in which the moulded body meshes.

5. The device according to claim 1, wherein at least one connection part has at least one recess, wherein the recess overlaps with at least one semiconductor chip of the plurality of semiconductor chips.

6. The device according to claim 1, wherein the semiconductor chip overlaps with the recess and with the lead frame in plan view of the device.

7. The device according to claim 1, wherein at least one further semiconductor chip of the plurality of semiconductor chips is electrically conductively connected to the connection parts only via an end-side semiconductor chip of the plurality of semiconductor chips.

8. The device according to claim 1, wherein a radiation conversion material is arranged between a rear-side of the semiconductor chips facing the moulded body and a rear-side of the device.

9. The device according to claim 1, wherein the device is an LED filament.

10. A method for producing a plurality of devices according to claim 1 with the steps of:
a) providing a lead frame having a plurality of device regions;
b) forming the lead frame with a radiation-transmissive moulding material by a moulding process to form a moulded body composite;
c) arranging a plurality of semiconductor chips configured to generate radiation on the moulded body composite;
d) producing an electrically conductive connection between the semiconductor chips and the lead frame;
e) applying a front-side cover to the front-side of the moulded body composite, which is adjacent to the plurality of semiconductor chips, and applying a rear-side cover to a rear-side of the moulded body composite opposite the front-side cover; and
f) separating the moulded body composite between adjacent device regions into the plurality of devices, wherein the devices each comprise a part of the lead frame, a part of the moulded body composite as a moulded body, a part of the front-side cover, a part of the rear-side cover and a plurality of semiconductor chips.

11. The method according to claim 10, wherein the lead frame and the moulded body composite are severed during separation.

12. The method according to claim 10, wherein in step f) the front-side cover in step e) is severed.

13. A device with a lead frame, a moulded body and a plurality of semiconductor chips configured to generate radiation, wherein
the lead frame has two connection parts for external electrical contacting of the device;
the moulded body is formed to the lead frame;
the moulded body is transmissive to the radiation generated during operation of the device;
the semiconductor chips are arranged on a front-side of the moulded body and each of the semiconductor chips overlap with the moulded body in plan view of the device;
the device has a front-side cover on the front-side of the moulded body;
the device has a rear-side cover on a rear-side of the moulded body opposite the front-side;
at least one connection part runs along a main direction of extension of the device along an entire side surface of at least one semiconductor chip of the plurality of semiconductor chips;
at least one connection part has at least one recess, wherein the recess overlaps with at least one semiconductor chip of the plurality of semiconductor chips; and
the semiconductor chip is completely arranged within the recess in plan view of the device.

14. A device with a lead frame, a moulded body and a plurality of semiconductor chips configured to generate radiation, wherein
the lead frame has two connection parts for external electrical contacting of the device;
the moulded body is formed to the lead frame;
the moulded body is transmissive to the radiation generated during operation of the device;
the semiconductor chips are arranged on a front-side of the moulded body and each of the semiconductor chips overlap with the moulded body in plan view of the device;
the device has a front-side cover on the front-side of the moulded body;
the device has a rear-side cover on a rear-side of the moulded body opposite the front-side;
at least one connection part runs along a main direction of extension of the device along an entire side surface of at least one semiconductor chip of the plurality of semiconductor chips; and
the front-side cover, the moulded body and the lead frame terminate flush with at least one side surface of the device.

15. The device according to claim 14, wherein the front-side and the rear-side cover are not directly adjacent to one another at any point.

\* \* \* \* \*